US010339997B1

(12) United States Patent
Penney

(10) Patent No.: US 10,339,997 B1
(45) Date of Patent: Jul. 2, 2019

(54) MULTI-PHASE CLOCK DIVISION

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/845,874

(22) Filed: Dec. 18, 2017

(51) Int. Cl.
*G11C 11/4076* (2006.01)
*G11C 11/4096* (2006.01)
*G11C 7/10* (2006.01)

(52) U.S. Cl.
CPC .......... *G11C 11/4076* (2013.01); *G11C 7/109* (2013.01); *G11C 7/1078* (2013.01); *G11C 11/4096* (2013.01)

(58) Field of Classification Search
CPC ... G11C 7/109; G11C 7/1078; G11C 11/4076; G11C 11/4096
USPC .......................................................... 365/193
See application file for complete search history.

(56) References Cited

U.S. PATENT DOCUMENTS

| 6,909,643 | B2 * | 6/2005 | Kwean | G11C 7/1039 |
| | | | | 365/189.05 |
| 7,404,116 | B2 | 7/2008 | Wang | |
| 7,450,442 | B2 * | 11/2008 | Kang | G11C 7/1006 |
| | | | | 365/191 |
| 7,889,594 | B2 | 2/2011 | Yoon et al. | |
| 7,975,162 | B2 * | 7/2011 | Kim | G11C 7/1078 |
| | | | | 365/219 |
| 8,164,975 | B2 * | 4/2012 | Vo | G11C 7/1027 |
| | | | | 365/193 |
| 9,183,902 | B2 * | 11/2015 | Moon | G11C 7/1087 |
| 9,530,472 | B1 * | 12/2016 | Park | G11C 7/1012 |
| 10,073,619 | B2 * | 9/2018 | Chae | G11C 8/12 |
| 2004/0268016 | A1 * | 12/2004 | Lee | G11C 7/1066 |
| | | | | 711/1 |
| 2010/0164853 | A1 | 7/2010 | Kim | |
| 2011/0204941 | A1 | 8/2011 | Lee | |
| 2014/0126305 | A1 | 5/2014 | Vo | |

OTHER PUBLICATIONS

International Search Report and the Written Opinion of the International Searching Authority, or the Declaration dated Jan. 7, 2019 (Jan. 7, 2019) in International application No. PCT/US2018/045847.

* cited by examiner

*Primary Examiner* — Son L Mai
(74) *Attorney, Agent, or Firm* — Fletcher Yoder, P.C.

(57) ABSTRACT

Devices and methods include receiving write command at a command interface of the semiconductor device to write data to memory. An external data strobe is received at a data strobe pin of the semiconductor device. The received external data strobe is divided into multiple phases using phase division circuitry to divide the data strobe into multiple phases to be used in writing the data to the memory.

22 Claims, 8 Drawing Sheets

MULTI-PHASE CLOCK DIVISION

BACKGROUND

Field of the Present Disclosure

Embodiments of the present disclosure relate generally to the field of semiconductor devices. More specifically, embodiments of the present disclosure relate to using a multi-phase clock when the starting phase is unknown.

Description of Related Art

Semiconductor devices (e.g., memory devices) often utilize clocks to perform functions. As frequency speeds increase, it may be helpful to divide a fast clock into multiple phases for internal use of a portion (e.g., dynamic random-access memory (DRAM). However, by dividing the clock into multiple phases, it may be unknown which starting phase first receives a first incoming clock for the clock. Variable write preamble lengths may also cause incorrect bit counting in a phase of the multiple phases when write preamble lengths change from a default length.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

At fast clock frequencies, such as those used for DDR5, an external clock frequency may be divided for internal use by the DRAM. For example, a number (e.g., 4) phases may be generated internally for the single external clock. When dividing the clock for a data strobe pin (DQS), the starting state of the multi-phase generator may not be known at the time a write command is entered because the DQS clock may start and stop only when entering write data bursts. These bursts may come so close together that there is not enough time to reset the DQS clock circuitry between bursts. However, which phase coming out of the generator is leading should be known in order to correctly capture and order the write data.

Furthermore, if a length of a write preamble is programmable, a period at which to begin counting bits in the DQS phases may cause incorrect bit counting without optional delays that are used to delay counting bits until an appropriate period of time has elapsed. Accordingly, delay circuitry may be included that is selected for use when a first preamble length (e.g., 2 or 3 cycles) is used and may be bypassed when a second preamble length (e.g., 1 cycle) is used.

Figure 1:
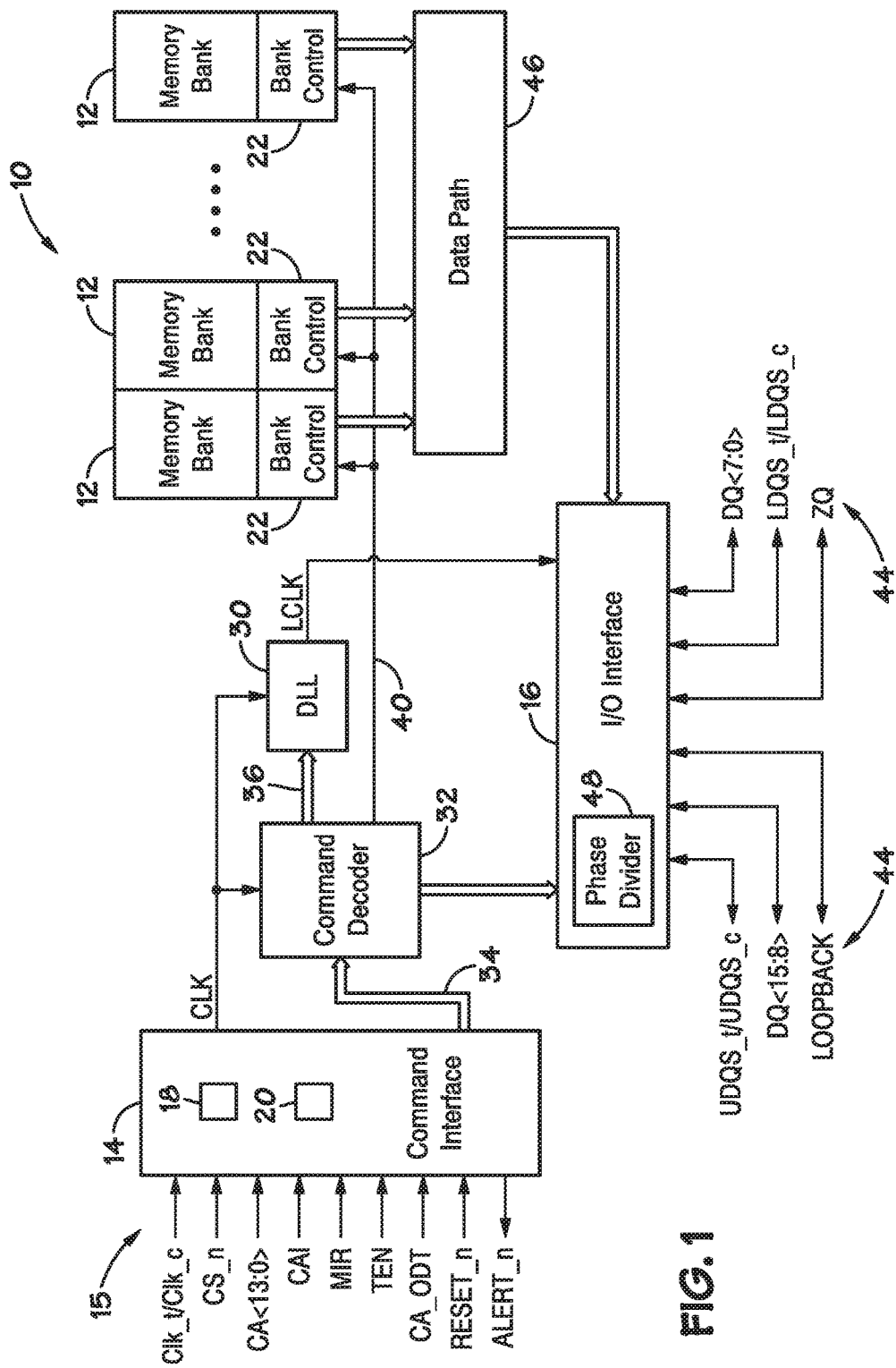
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n)

from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_b), the DQS signals may be provided as a differential pair of data strobe signals (DQS_t/and DQS_b) to provide differential pair signaling during reads and writes. For certain memory devices, such as a DDR5 SDRAM memory device, the differential pairs of DQS signals may be divided into upper and lower data strobe signals (e.g., UDQS_t/and UDQS_b; LDQS_t/and LDQS_b) corresponding to upper and lower bytes of data sent to and from the memory device 10, for instance. In some embodiments, as discussed below, the IO interface 16 may include phase divider circuitry 48 that splits the DQS signal into multiple (e.g., 4) phases. The IO interface 16 may also include phase detection circuitry to detect which phase receives a first pulse when sets of pulses on the DQS pin occur too frequently to enable the clock input circuit 18 to reset between sets of pulses.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
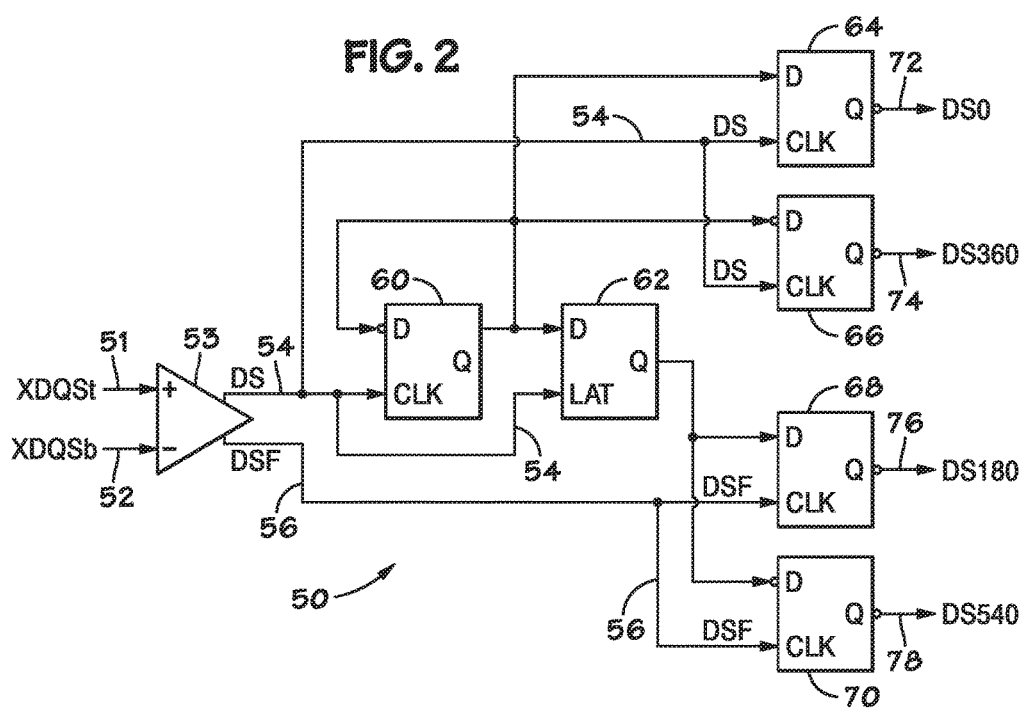
FIG. 2 is a schematic view of multi-phase generation circuitry used to receive a data strobe for a write command and divide the data strobe into multiple phases, according to an embodiment of the present disclosure.

FIG. 2 illustrates a multi-phase generation circuitry 50 that may be implemented in the IO interface 16. The multi-phase generation circuitry 50 receives an external DQS (XDQSt) signal 51 (e.g., UDQS_t) that runs at the same speed as the clock and may be turned on or off. In some embodiments, as discussed previously, the external DQS signal 51 may be accompanied by an external bar DQS (XDQSb) signal 52 that is complementary to the external DQS signal 51. These signals may be transmitted to an amplifier 53 to provide an internal DS signal 54 and/or a complementary internal DS false signal 56. The amplifier 53 changes the power of the external DQS signal 51 from an external level to a level appropriate for use in the memory device 10.

As illustrated, the multi-phase generation circuitry 50 uses the internal DS signal 54 and/or the internal DS false signal to divide the signal out using a toggle flip-flop 60 that toggles its output each time a pulse occurs on the internal DS signal 54. The multi-phase generation circuitry 50 also includes a latch 62 that latches the output from the toggle flip-flop 60 to track falling edges of the internal DS signal 54. In other words, the toggle flip-flop 60 sets a rising mode that causes changes of states in rising edge flip-flops 64 and/or 66 on rising edges of the internal DS signal 54. Moreover, the toggle flip-flop 60 and the latch 62 work together to set a falling mode that causes changes of state in falling edge flip-flops 68 and/or 70 during a falling edge of the internal DS signal 54.

DS0 72 corresponds to an output of the rising edge flip-flop 64. DS0 72 transitions high with every other rise of the external DQS signal 51. DS360 74 corresponds to a rising edge flip-flop 66. DS360 74 transitions high on rising edges of the external DQS signal 51 between those causing DS0 72 to go high. In other words, rising edges of the external DQS signal 51 alternate between causing DS0 72 and DS360 to go high.

DS180 76 corresponds to an output of the falling edge flip-flop 68. Due to the use of the internal DS false signal 56, DS180 76 transitions high with every other falling edge of the external DQS signal 51. Similarly, DS540 78 corresponds to an output of the falling edge flip-flop 70 and transitions high with the other alternating falling edges of the external DQS signal 51. In other words, DS0 72, DS360 74, DS180 76, and DS540 78 are each half-frequency signals transitioning high when a corresponding rising edge or falling edge of the external DQS signal 51 is received.

Figure 3:
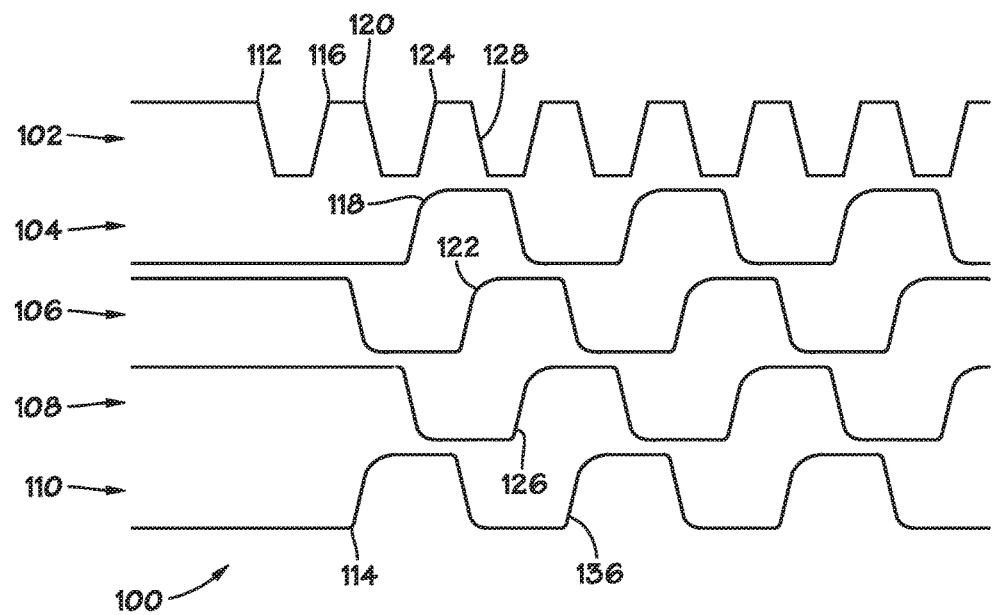
FIG. 3 is a graph of an external data strobe and multiple phases of the data strobe from the multi-phase generation circuitry of FIG. 2, according to an embodiment of the present disclosure.

FIG. 3 illustrates a graph 100 showing waveforms 102, 104, 106, 108, and 110. The waveform 102 illustrates an embodiment of the external DQS signal 51. The waveform 104 illustrates a DS0 72 resulting from the external DQS signal 51. The waveform 106 illustrates a DS180 76 resulting from the external DQS signal 51. The waveform 108 illustrates a DS360 74 resulting from the external DQS signal 51. The waveform 110 illustrates a DS540 78 resulting from the external DQS signal 51. As illustrated, the waveform 102 has a first frequency, and the waveforms 104, 106, 108, and 110 have a frequency that is half the frequency of the first frequency.

A falling edge 112 of the waveform 102 causes a rise 114 of the waveform 110. Similarly, a rising edge 116 of the waveform 102 causes a rise 118 of the waveform 104. Likewise, a falling edge 120 of the waveform 102 causes a rise 122 of the waveform 106, and a rising edge 124 of the waveform 102 causes a rise 126 of the waveform 108. A falling edge 128 of the waveform 102 causes another rise 130 of the waveform 110.

Figure 4:
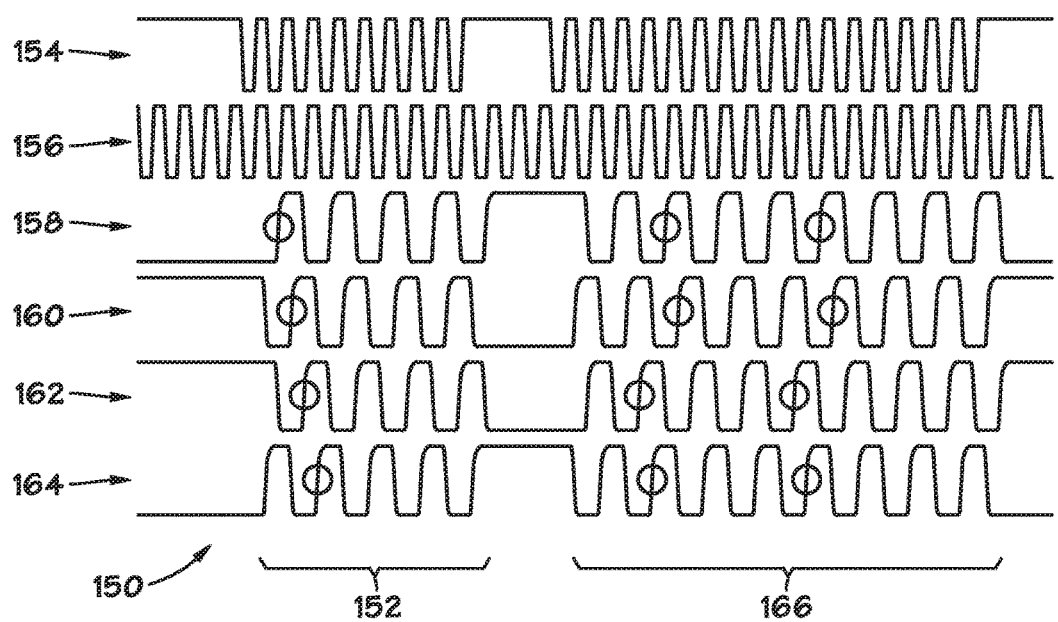
FIG. 4 is a graph of an external data strobe and multiple phases of the data strobe from the multi-phase generation circuitry of FIG. 2 with two bursts without a reset between the bursts, according to an embodiment of the present disclosure.

FIG. 4 illustrates a graph 150 depicting a possible detection issue with the multi-phase generation circuitry 50. Namely, an ordering of the phases output from the multi-phase generation circuitry 50 may be dependent upon a starting state of the multi-phase generation circuitry 50. The external DQS signal 51 is not a continuous clock. Instead, it is started and stopped only for write data entry; the starting state may vary between write data entry bursts. This variation may depend upon a length of the bursts and/or whether preamble/postamble edges included in the external DQS signal 51. Furthermore, use of a Cyclical Redundancy Check (CRC) can add an extra rise edge and extra fall edge to the external DQS signal 51 for a write data entry burst. This extra rise edge and extra fall edge may change the starting state of the multi-phase generator for the next write command. The external DQS signal 51 may go indeterminate when not used to save power. This indeterminacy may also change the starting state of the multi-phase generation circuitry 50 for a write burst. Specifically, as illustrated, it may be difficult to determine whether incoming bursts on the external DQS signal 51 DS0 72 latches the first bit of write data or DS360 76 does. Specifically, as illustrated, a first burst 152 of DQS pulses 154 aligned to a clock 156 causes pulses in an order of waveform 158 (DS0), waveform 160 (DS180), waveform 162 (DS360), and then waveform 164 (DS540). However, a second burst 166 causes pulses in an order of waveform 162 (DS360), waveform 164 (DS540), waveform 158 (DS0), and then waveform 160 (DS180).

Figure 5:
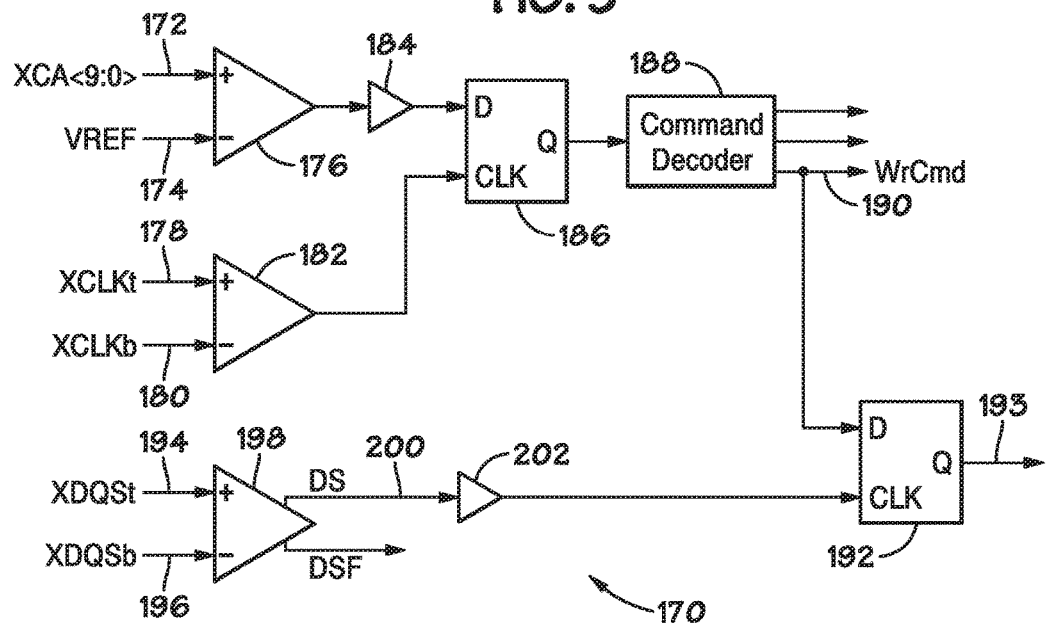
FIG. 5 is a schematic view of write command reference circuitry that may utilize a write command as a reference point for the external data strobe, according to an embodiment of the present disclosure.

Since, in some embodiments, a write command always accompanies a start of the external DQS signal 51, the write command may be used as a reference for the external DQS signal 51. FIG. 5 illustrates write command reference circuitry 170 that may utilize a write command as a reference point for the external DQS signal 51. In some embodiments, the write command reference circuitry 170 may be implemented in the command interface 14 and/or the IO interface 16. An external command 172 is received at the command interface 14. The command reference circuitry 170 may submit the external command 172 along with a reference voltage 174 to an amplifier 176 for amplification to a level suitable for use in the memory device 10. To capture the external command 172, the command reference circuitry 170 receives an external clock 178. In some embodiments, the command reference circuitry 170 receives the external clock 178 along with an external clock bar 180 at a differential receiver 182. The command reference circuitry 170 utilizes a delay 184 to match clock signals out of the differential receiver 182. The command reference circuitry 170 then delays the received commands using a delay to align the delay to clock. The command reference circuitry 170 then uses a flip-flop 186 to capture the command using the clock. The captured commands are then passed to a command decoder 188 that decodes the external command 172 into a command. A write command 190 is one of the possible commands to which the command decoder 188 may decode the external command 172. When the write command 190 is decoded, the command reference circuitry 170 may route the write command 190 to a flip-flop 192 that produces an output 193 that indicates when to start counting data bits. The flip-flop 192 uses an external DQS signal 194 (e.g., the external DQS signal 51) that may be received with an external DQS bar signal 196 at a differential receiver 198 to amplify/produce an internal DS signal 200. The command reference circuitry 170 may also include delay circuitry 202 that adds delay to the DQS path to match delays through the write command path to the flip-flop 192.

Figure 6:
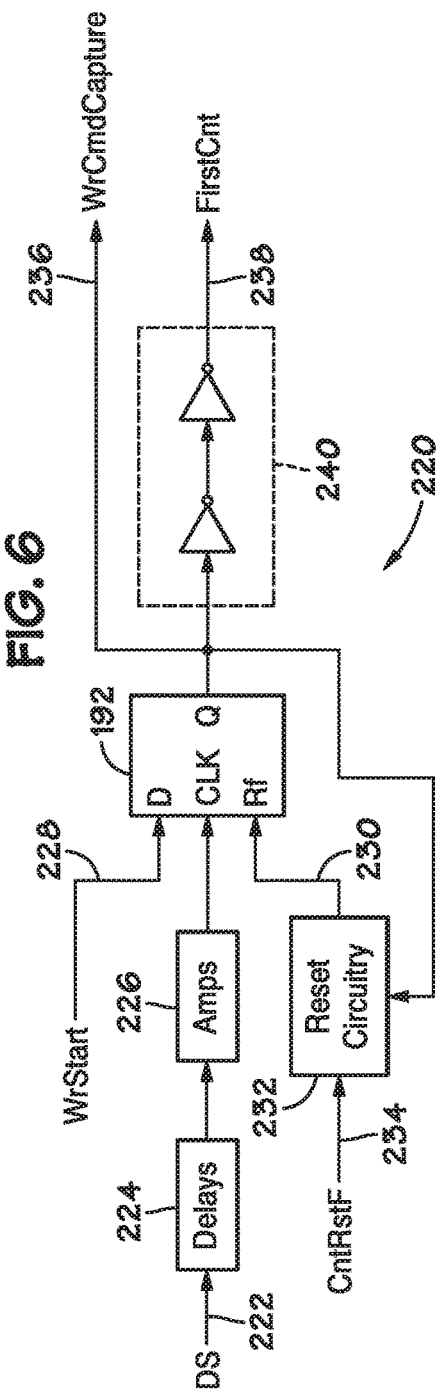
FIG. 6 is a schematic view of circuitry that may be used for capturing a write command and performing bit counting in one or more phases, according to an embodiment of the present disclosure.

FIG. 6 illustrates an embodiment of circuitry 220 that may be used for capturing a write command and performing bit counting. In some embodiments, the circuitry 220 may be implemented in the command interface 14 and/or the IO interface 16. The circuitry 220 may be included for phase-divided DS 222. Specifically, separate instances of the circuitry 220 may be applied to a pair of falling edge phases or a pair of rising edge phases. For example, the DS 222 may be DS180 76 for a first instance of the circuitry 220 used to determine whether any data has come through the DS 222 for DS180 76. Similarly, a second instance of the circuitry 220 may receive the DS 222 as DS540 78 to be used to determine whether any data has come through the DS 222 for DS540 78.

Data on the DS 222 may be delayed by delays 224 and/or be amplified by amplifiers 226. The delays 224 may include a string of delays to coordinate the DS 222 with other signals, such as a WrStart 228 that indicates that a write command may be started to start counting the next data on DS 222. To do this count, the circuitry 220 uses the flip-flop 192 (of FIG. 5) that receives the WrStart 228 and uses the DS 222 to clock the WrStart 228. The flip-flop 192 may be reset using a reset 230 that may be generated from a feedback loop from an output of the flip-flop 192 and/or other processing logic (e.g., additional flip-flops, AND gates, and/or NOR gates) to cause the flip-flop 192 to reset after DS 222 has been tracked. The output of the flip-flop 192 may be used as a WrCmdCapture 236 that indicates that a WrStart 228 has been captured with the DS 222. In some embodiments, the WrCmdCapture 236 may be a logic-high or logic-low signal (e.g., undergoes inversion logic). The output of the flip-flop 192 may also be used as a FirstCnt 238 that indicates that data has come through the DS 222 for the corresponding phase (e.g., DS180 76). In some embodiments, this FirstCnt 238 may be distributed throughout the memory device 10. Accordingly, the FirstCnt 238 may be amplified using one or more amplification inverters 240. As illustrated, these amplification inverters 240 may be staggered to increase drive strength for potentially large capacitive loads.

Figure 7:
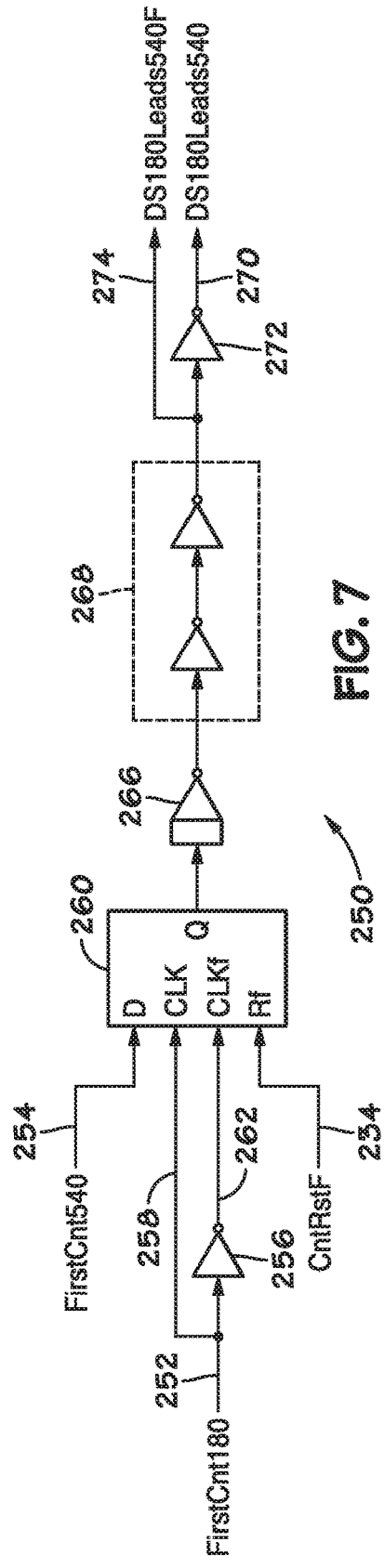
FIG. 7 is a schematic view of phase detection circuitry that may be used for detecting which phase of the multiple phases of FIG. 2 have been received first, according to an embodiment of the present disclosure.

Using FirstCnt 238 from multiple instances of the circuitry 220, the memory device 10 may determine which instances of the circuitry 220 have received data on DS 222 first. To perform this determination, the memory device 10 may include a phase detector 250, as illustrated in FIG. 7 in the command interface 14 and/or the IO interface 16. The phase detector 250 receives FirstCnt180 252 that indicates that data has been received on DS 222 with a write command start on a first instance (e.g., circuitry 220 corresponding to DS180 76) and a FirstCnt540 254 that indicates that data has been received on DS 222 with a write command start on a second instance (e.g., circuitry 220 corresponding to DS540 78). As illustrated, the FirstCnt180 252 may be inverted using an inverter 256 to generate an inverted FirstCnt180 252. The FirstCnt180 may be used as a clock 258 for the FirstCnt540 for a flip-flop 260. The inverted FirstCnt180 252 may submitted to a complementary clock 262 of the flip-flop 260. The flip-flop 260 may be reset using the CntRstF 234. The phase detector 250 may also delay an output of the flip-flop 260 using a delay 266 to delay the output. The phase detector 250 may include amplifying inverters 268 that amplify the output to provide enough strength to drive the output to one or more locations in the memory device 10. The output corresponds to DS180leads540 270 that indicates that data on DS180 76 occurs before DS540 78. As illustrated, DS180leads540 270 passes through an inverter 272. The inverter 272 may provide additional amplification similar to the amplifying inverters 268. Due to the operation of the inverter 272, DS180leads540F 274 may be generated before the inverter 272 as an inverted DS180leads540 270. In other words, the DS180leads540F 274 indicates that data on DS540 78 for the write command occurs before data on the DS180 76.

Figure 8:
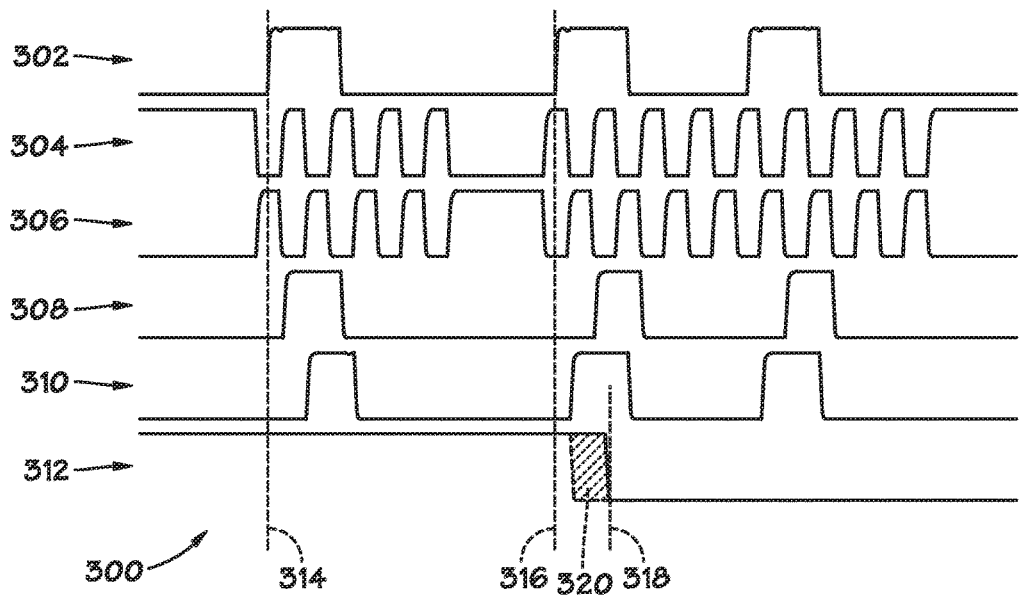
FIG. 8 is a graph of counting signals and a leading signal resulting from the phase detection circuitry of FIG. 7, according to an embodiment of the present disclosure.

FIG. 8 illustrates a graph 300. The graph 300 illustrates a write start signal 302, a first DS signal 304 for a first phase (e.g., DS180 76), a second DS signal 306 for a second phase (e.g., DS540 78), a first count signal 308 for the first phase, a second count signal 310 for the second phase, and a leading signal 312 that indicates whether the first DS signal 304 occurs before the second DS signal 306. As illustrated, at a first time 314, the write start signal 302 transitions high thereby causing a check of which signal change occurs next. In the illustrated embodiment, the count signals 308 and 310 correspond to rising edge phase signals (e.g., DS0 72 and DS360 74). However, in other embodiments, the count signals 308 and/or 310 may correspond to falling edges. After the first time 314, the first DS signal 304 transitions high first causing the first count signal 308 to go high before the second count signal 310. This order of change to the count signals 308 and 310 causes the leading signal 312 to remain high. If the leading signal 312 had previously been low, the order of change in the count signals 308 and 310 would have caused the leading signal 312 to go high.

At a next time 316 with the write start signal 302 transitioning high, the second DS signal 306 transitions high before the first DS signal 304. Accordingly, the second count signal 310 transitions high before the first count signal 308. However, since the first count signal 308 may clock the flip-flop 260, a change in the leading signal 312 does not occur until the first count signal 308 pulses at time 318. Thus, using the first count signal 308 as a clock for the flip-flop 260 may cause a delay 320 (e.g., ½ cycle) from the second count signal 310 transitioning high and phase detection propagation to the leading signal 312 when clock cycles into DS 222 are not in an even number and the phase detector 252 does not have sufficient time to reset between DS pulses.

Figure 9:
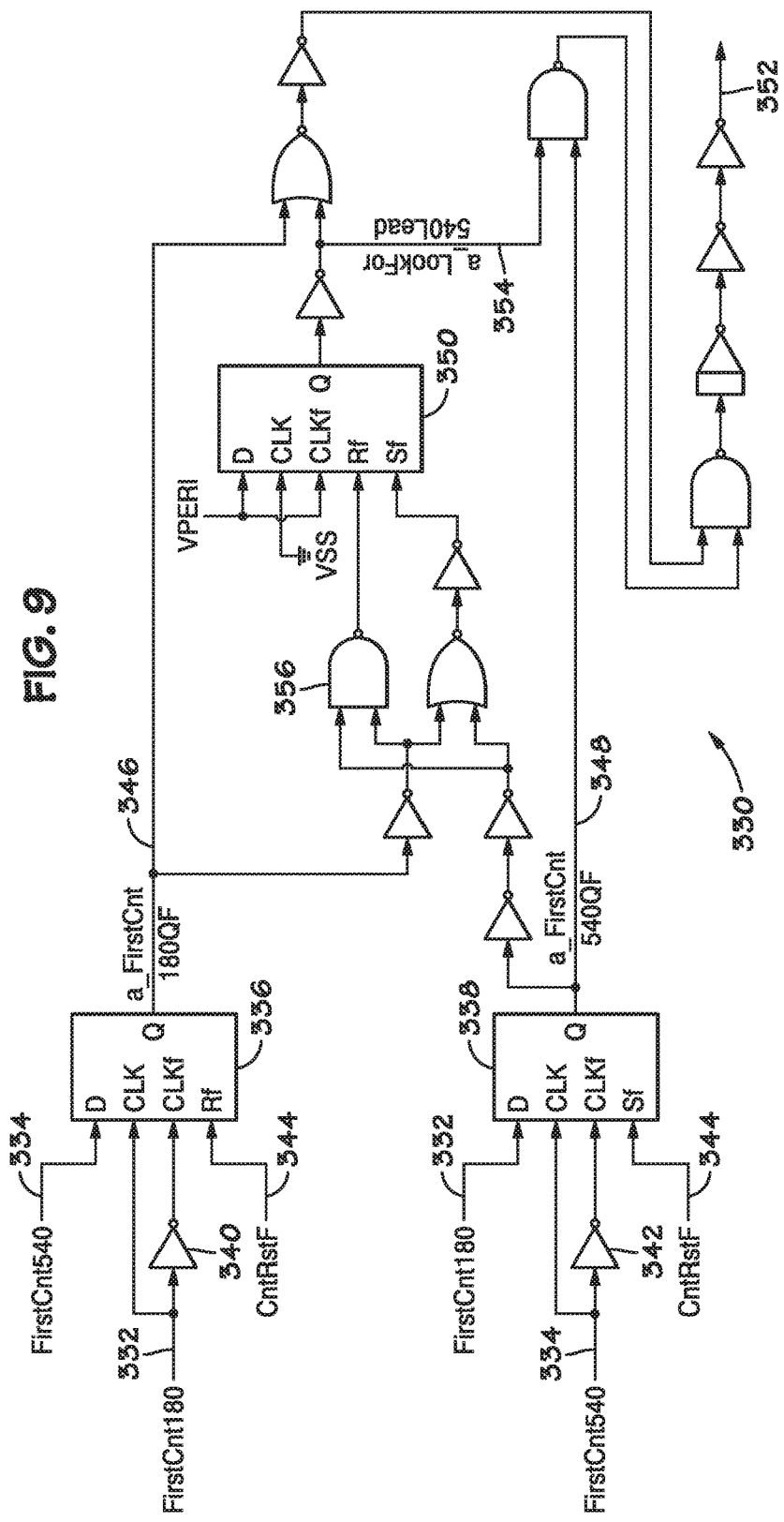
FIG. 9 is a schematic view of dual-channel phase detection circuitry that may be used for detecting which phase of the multiple phases of FIG. 2 have been received first, according to an embodiment of the present disclosure.

FIG. 9 illustrates an alternative embodiment of a phase detector 330 that may be implemented in the command interface 14 and/or the IO interface 16. The phase detector 330 receives a FirstCnt180 332 that corresponds to an output of a first instance of the circuitry 220 and a FirstCnt540 334 that corresponds to an output of a second instance of the circuitry 220. In the illustrated embodiment, the FirstCnt180 332 corresponds to a first count signal for DS180 76, and the FirstCnt540 334 corresponds to a first count signal for DS540 78. In other embodiments, the FirstCnt180 332 may corresponds to a first count signal for DS0 72, and the FirstCnt540 334 may correspond to a first count signal for DS360 74. The phase detector 330 uses the FirstCnt180 332 to clock the FirstCnt540 336 at a flip-flop 336. Similarly, the phase detector 330 uses the FirstCnt540 336 to clock the FirstCnt180 332 at a flip-flop 338. In some embodiment, clocking using the FirstCnt540 334 may use complementary clocking signals using an inverter 340, and clocking using the FirstCnt180 332 may use complementary clocking signals using an inverter 342. Modes of the flip-flops 336 and 338 of the phase detector 330 may be reset using a reset signal 344.

An output, a_FirstCnt180QF 346, of the flip-flop 336 transitions high when FirstCnt540 334 is high and when the FirstCnt180 332 is high. Similarly, an output, a_FirstCnt540QF 348, of the flip-flop 338 transitions high when FirstCnt180 332 is high and when the FirstCnt540 334 is high. The phase detector 330 includes a keeper flip-flop 350 that keeps an output 352 of the phase detector 330 to a state using a_LookFor540lead 354. The a_LookFor540lead 354 is a pointer that when set high allows a_FirstCnt540QF 348 to immediately pass to the output 352 when a_FirstCnt540QF 348 is asserted (e.g., goes low). Until a_FirstCnt540QF 348 is asserted, a_LookFor540lead 354 will keep the output 352 at a high state indicating that DS180 76 occurs before DS540 78 in the current burst.

After a_FirstCnt540QF 348 is asserted and is immediately passed through to the output 352, the keeper flip-flop 350 will continue to hold a_LookFor540lead 354 high until a_FirstCnt180QF 346 is deasserted by FirstCnt180 332 firing. Then the state of a_FirstCnt180QF 346 is combined with the low state of a_FirstCnt540QF 348 to assert a set pin on the keeper flip-flop 350 to reset a_LookFor540lead 354 to low.

Since a_LookFor540lead 354 is then low, this setting allows the a_FirstCnt180QF 346 to immediately pass through to the output 352 when a_FirstCnt180QF 346 is asserted (e.g., goes low). Until a_FirstCnt180QF 346 is asserted, a_LookFor540lead 354 being low will keep the output 352 in a low state, which indicates that DS180 76 occurs after DS540 78 in the current burst.

After a_FirstCnt180QF 346 is asserted and is immediately passed through to the output 352, the keeper flip-flop 350 will continue to hold a_LookFor540lead 540 low until a_FirstCnt540QF 348 is deasserted (e.g., transitions high) by FirstCnt540 334 firing after the FirstCnt180 332 first fired in the current burst. The state of the a_FirstCnt540QF 348 is combined with the low state of a_FirstCnt180QF 346 in gate 356 to assert the reset pin of the keeper flip-flop 350 to set a_LookFor540lead 354 back to high.

Although the foregoing embodiments include assertions that are logic lows or logic highs, the assertions may be in a logically opposite position in some embodiments. For example, NAND gates and/or inverters may be replaced in some embodiments.

Figure 10:
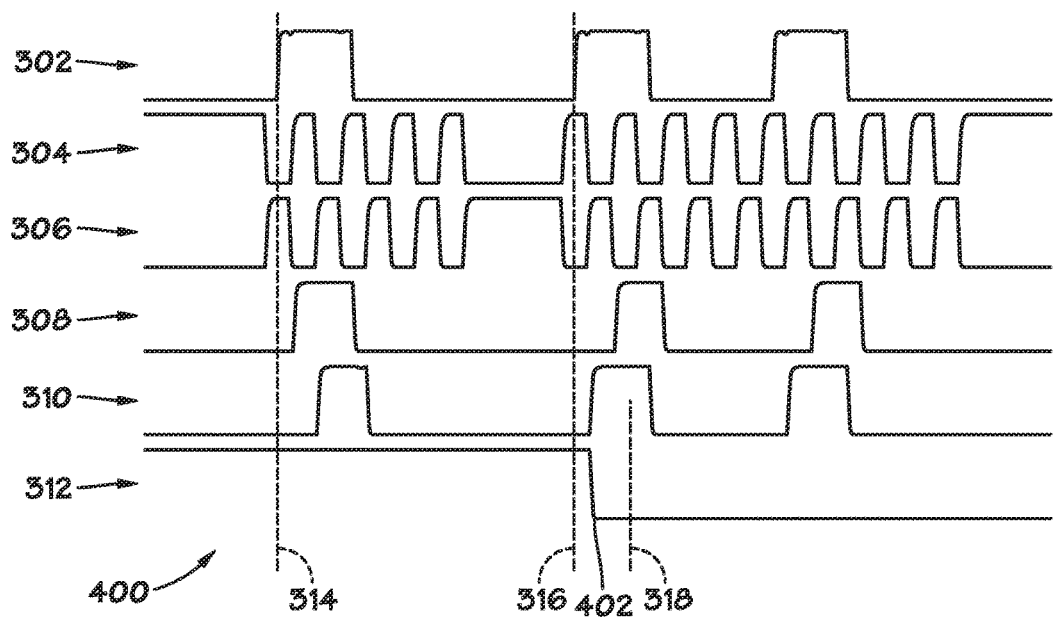
FIG. 10 is a graph of counting signals and a leading signal resulting from the phase detection circuitry of FIG. 7, according to an embodiment of the present disclosure.

FIG. 10 illustrates a graph 400. The graph 400 is similar to the graph 300 of FIG. 8 with the leading signal 312 changing at time 402 instead of time 318. The leading signal 312 is asserted properly in the graph 400 due to the function of the phase detector 330 previously discussed.

Figure 11:
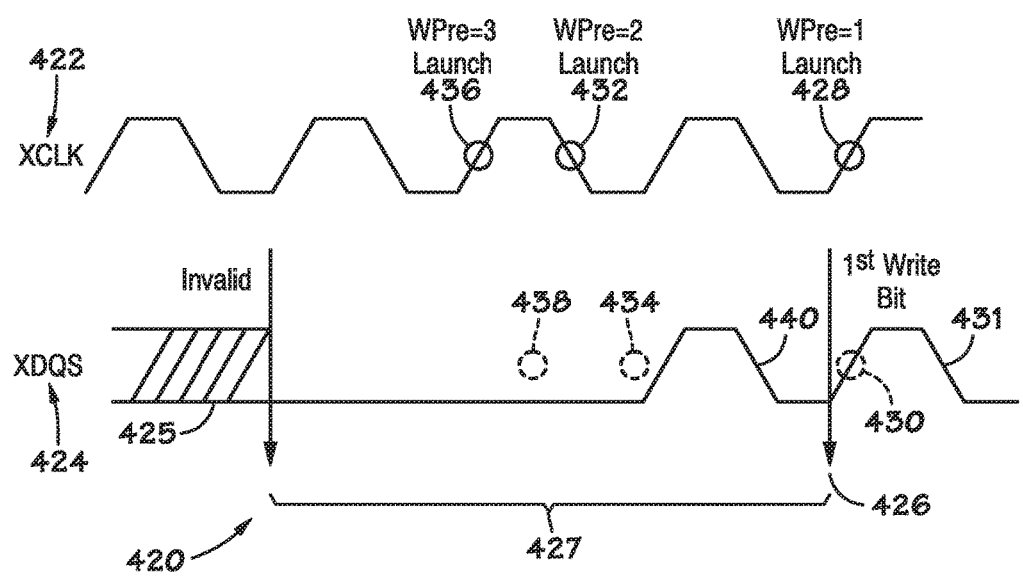
FIG. 11 is a timing diagram illustrating different bit counting timing for different write preamble lengths for the write command of FIG. 2, according to an embodiment of the present disclosure.

The foregoing discussion assumes a set length (e.g., 1 cycle) of a write preamble, but some memory devices may utilize programmable write preamble lengths. FIG. 11 illustrates a timing diagram 420 illustrating an external clock 422 and an external DQS 424. As previously discussed, the external DQS 42 may be indeterminate during a period 425 before a write command has been received. A write bit is received at write time 426. Before the bit, a preamble period 427 occurs. In some embodiments, the preamble period 427 may have a duration equal or greater than a maximum programmable preamble length. The write at write time 426 causes a first write launch 428 and a corresponding DQS launch 430 when a first preamble length (e.g., 1) is set. A first live bit of the external DQS 424 is captured at a falling edge 431 of the external DQS 424. At this falling edge 431, the write is captured and counting begins.

Similarly, when a second preamble length (e.g., 2) is set, the write at the write time 426 causes a second write launch 432 and a corresponding DQS launch 434. Moreover, when a third preamble length (e.g., 3) is set, the write at the write time 426 causes a third write launch 436 and a corresponding third DQS launch 438. With the second or third preamble lengths, a falling edge 440 of the external DQS 424, the write is captured and counting begins.

Figure 12:
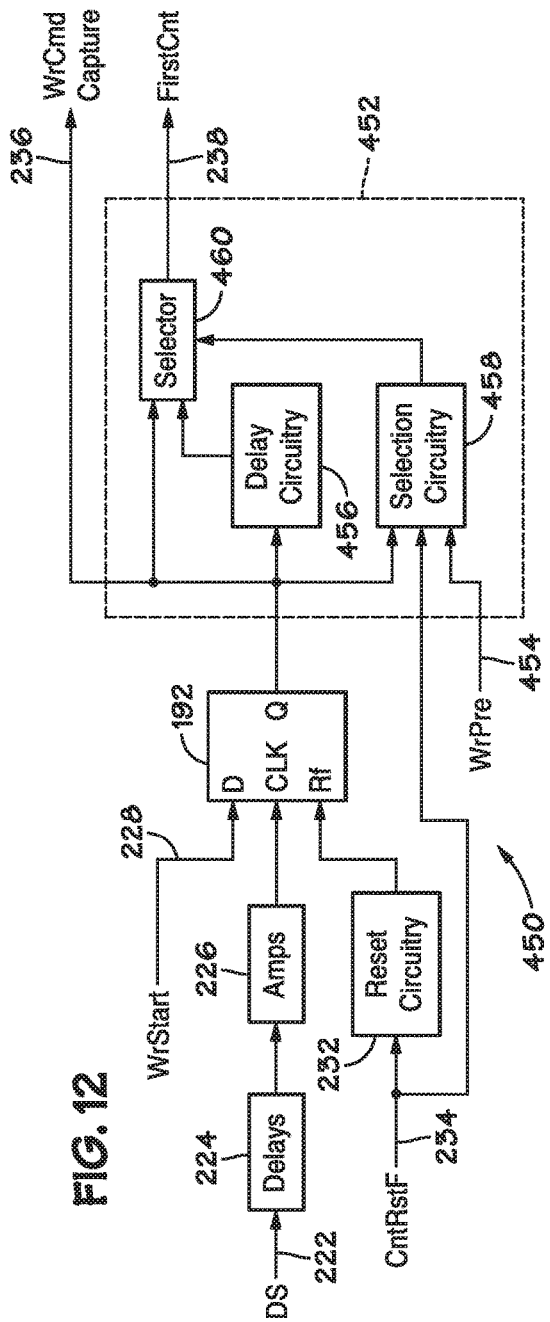
FIG. 12 is a schematic view of circuitry used to count bits for a channel corresponding to a phase of FIG. 2 that also includes delay circuitry, selection circuitry, and a selector that together provide flexibility for variable write preamble lengths, according to an embodiment of the present disclosure.

FIG. 12 illustrates circuitry 450 that may be used to provide flexibility due to programmable write preamble lengths. Similar to the circuitry 220, the circuitry 450 may be implemented in the command interface 14 and/or the IO interface 16. The circuitry 450 is similar to the circuitry 220 with preamble adjustment circuitry 452 that may be used to adjust timing based on a preamble length as indicated by a WrPre 454. The preamble adjustment circuitry 452 utilizes delay circuitry 456 to delay a copy of an output from the flip-flop 192. Since the output of the flip-flop 192 may be used as passing through the delay circuitry 456 or passing around the delay circuitry 456 without its delays, the preamble adjustment circuitry 452 may utilize selection circuitry 458 to select between using the delay circuitry 456 and bypassing the delay circuitry 456. As illustrated, the selection circuitry 458 may utilize the WrPre 454 to select which output to use. Output(s) from the selection circuitry 458 may select the output between outputs of the flip-flop 192 through the delay circuitry 456 or bypassing the delay circuitry 456. In some embodiments, the circuitry 450 with the preamble adjustment circuitry 452 may be included for only one phase (e.g., DS180 76) instead utilizing a signal from a corresponding other phase (e.g., DS540 78) to indicate whether the corresponding other phase has captured a write command. In some embodiments, the preamble adjustment circuitry 452 may be included independently in each phase.

Figure 13:
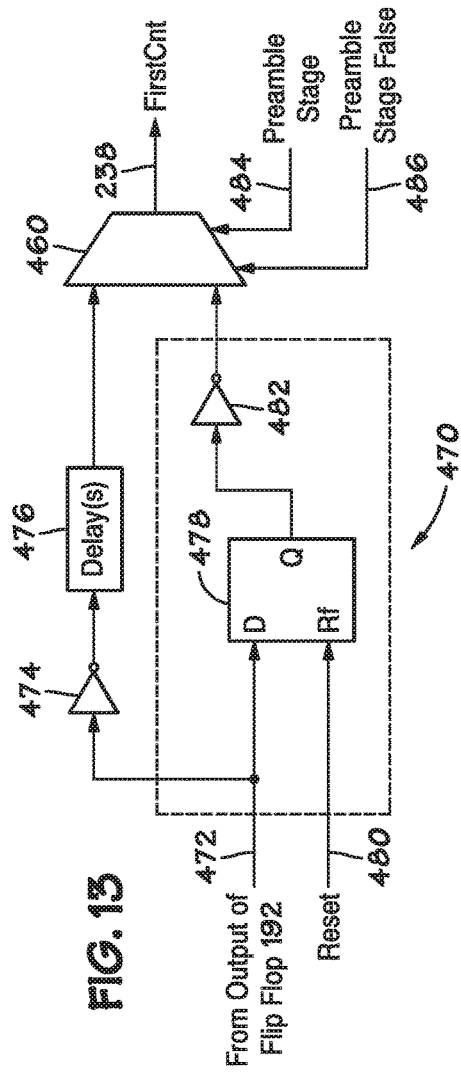
FIG. 13 is a schematic view of the delay circuitry and the selector of FIG. 12, according to an embodiment of the present disclosure.

FIG. 13 illustrates an embodiment of circuitry 470 including the delay circuitry 456 and the selector 460. In the illustrated embodiment, the selector 460 includes a multiplexor. The illustrated delay circuitry 456 receives an output 472 from the flip-flop 192. The delay circuitry 456 may route a first version of this output 472 to an inverter 474. In some embodiments, the inverter 474 inverts the output 472 assertion polarity (e.g., from a logic-low assertion to a logic-high assertion). However, in some embodiments, this inversion may be omitted by omitting the inverter 474. The output 472 (either inverted or as-received) is passed to delays 476 that ensure that control signals from the selection circuitry 458 are propagated to the selector 460 before the output 472 passes through the selector 460.

The delay circuitry 456 also includes a delayed route that adds delays for long write preamble lengths. For example, the delay circuitry 456 may include a flip-flop 478 that receives the output 472 and delays the output for one cycle of the clock. In other words, the output 472 may be delayed from a clock edge used to pass the output 472 through the flip-flop 192 by using the next clock cycle of the clock to gate the output 472 using the flip-flop 478. Furthermore, in some embodiments, additional flip-flops may be used to add additional cycles of delay to provide additional possible preamble length (e.g., 4) timings. These additional flip-flops may be arranged in a chain that receives the output of the flip-flop with each of the additional flip-flops using the same clock as the flip-flop 192 with the output of each flip-flop passed to the selector 460 (e.g., in a same multiplexor or in a chain of multiplexors). The flip-flop 478 (and additional flip-flops) may be reset using a reset signal 480 from the selection circuitry 458.

Figure 14:
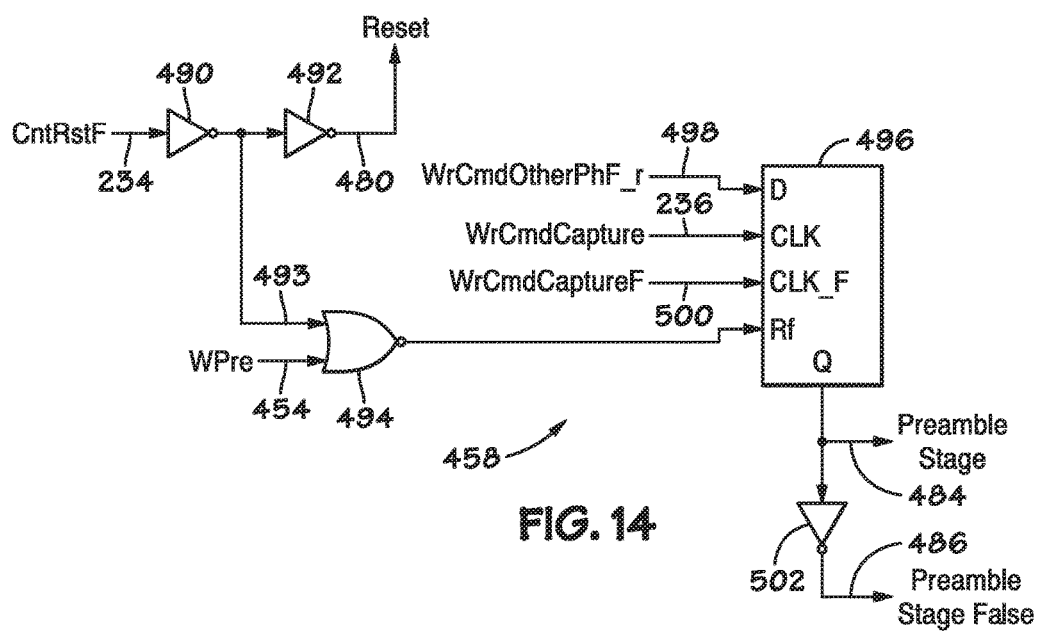
FIG. 14 is a schematic view of the selection circuitry of FIG. 12, according to an embodiment of the present disclosure.

The selector 460 receives a preamble stage 484 that indicates whether to delay the output with the delay circuitry 456 or to bypass the delay circuitry 456. In some embodiments, when the preamble stage 484 is high, the delay circuitry 456 is utilized. Otherwise, the delay circuitry 456 is bypassed. In embodiments with additional possible stages, the preamble stage 484 may include more than a single binary bit, such as an encoded bit stream or multiple lines. In some embodiments, a preamble stage false 486 may be used as a complement to the preamble stage 484 to ensure that the preamble stage 484 is interpreted properly. As illustrated in FIG. 14, the preamble stage 484 and/or the preamble stage false 486 are generated in the selection circuitry 458.

The selection circuitry 458 receives the CntRstF 234 and the WrPre 454. The CntRstF 234 sets whether the count is to be reset. WrPre 454 indicates whether (and/or how many) delay circuitries to delay in the delay circuitry 456 based on the write preamble length if the phase including the circuitry 450 captures the write command before the corresponding other phase. For example, as illustrated, if only one delay (e.g., flip-flop 478) is included WrPre 454 may indicate whether the delay should be used or bypassed. If more than a single delay is used, WrPre 454 may indicate a state corresponding to which delays are to be used.

CntRstF 234 may be inverted at inverter 490 and re-inverted at inverter 492 to produce the reset signal 480. CntRst 493 resulting from inversion at inverter 490 indicates whether a count is to be reset. The CntRst 493 and the WrPre 454 are submitted to a NOR gate 494 that resets a flip-flop 496 if the count is not to be reset and the preamble is a default value. The flip-flop 496 receives WrCmdCaptureOtherPhF 498 that indicates that another phase has not captured a write command. The flip-flop 496 clocks WrCmdCaptureOtherPhF 498 using WrCmdCapture 236 for the current phase and/or its complementary WrCmdCaptureF 500. The flip-flop 496 then outputs the preamble stage 484 asserting when the delay circuitry 456 is to be used. The selection circuitry 458 also includes an inverter 502 to produce the complementary preamble stage false 486 for transport to the selector 460.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
   memory;
   a command interface configured to receive a write command to write data to the memory;
   a data strobe pin configured to receive a data strobe to assist in writing the data to the memory; and
   phase division circuitry configured to divide the data strobe into a plurality of phases to be used in writing the data to the memory, wherein the phase division circuitry comprises:
      count detection circuitry configured to count bits received for a phase of the plurality of phases; and
      phase detection circuitry configured to identify which phase of the plurality of phases received a pulse of the data strobe first.

2. The semiconductor device of claim 1, wherein the plurality of phases comprises four phases.

3. The semiconductor device of claim 2, wherein:
   a first phase of the plurality of phases corresponds to rising edges of a first set of pulses of the data strobe;
   a second phase of the plurality of phases corresponds to falling edges of the first set of pulses of the data strobe;
   a third phase of the plurality of phases corresponds to rising edges of a second set of pulses of the data strobe, wherein each pulse of the second set of pulses occurs between two pulses of the first set of pulses; and
   a fourth phase of the plurality of phases corresponds to falling edges of the second set of pulses of the data strobe.

4. The semiconductor device of claim 1, comprising a toggle flip-flop that is configured to:
   receive the data strobe; and
   toggle between a first mode and a second mode with each pulse of the data strobe, wherein the first mode directs an output of the toggle flip-flop to a first channel, and the second mode directs the output to a second channel.

5. The semiconductor device of claim 4, wherein the first channel comprises:
   a first rising edge flip-flop that receives the output and uses the data strobe to output every other rising edge of the data strobe; and
   a second rising edge flip-flop that receives the output and uses the data strobe to output alternative rising edges between the every other rising edge of the data strobe.

6. The semiconductor device of claim 5, wherein the second channel comprises:
   a first falling edge flip-flop that receives the output and uses the data strobe to output every other falling edge of the data strobe; and
   a second falling edge flip-flop that receives the output and uses the data strobe to output alternative falling edges between the every other falling edges of the data strobe.

7. The semiconductor device of claim 6, wherein using the data strobe to output every other falling edge and alternative falling edges comprises using a data strobe false that is an inversion of the data strobe.

8. The semiconductor device of claim 6, wherein the second channel comprises a latch to track falling edges of the data strobe.

9. The semiconductor device of claim 1, comprising an amplifier that changes power of the data strobe from an external level to an internal level.

10. A semiconductor device comprising:
    memory;
    a command interface configured to receive a write command to write data to the memory;
    a data strobe pin configured to receive a data strobe to assist in writing the data to the memory; and
    phase division circuitry configured to divide the data strobe into a plurality of phases to be used in writing the data to the memory, wherein the phase division circuitry comprises count detection circuitry configured to count bits received for a phase of the plurality of phases.

11. The semiconductor device of claim 10, wherein the count detection circuitry counts bits for less than all of the plurality of phases.

12. The semiconductor device of claim 10, wherein the phase division circuitry comprises a channel for each phase of the plurality of phases, and wherein half of the channels include count detection circuitry.

13. The semiconductor device of claim 12, wherein the half of the channels that include count detection circuitry correspond to rising edges of the data strobe.

14. The semiconductor device of claim 12, wherein the half of the channels that include count detection circuitry correspond to falling edges of the data strobe.

15. The semiconductor device of claim 10, wherein the count detection circuitry comprises a flip-flop that is configured to:
    receive a write start as an input to the flip-flop;
    receive the data strobe as a clock for the flip-flop; and
    output a first count signal that indicates that a write command has begun being captured by the data strobe.

16. The semiconductor device of claim 15, wherein the flip-flop is configured to receive a reset signal to reset a state of the flip-flop to an initial state.

17. A semiconductor device comprising:
    memory;
    a command interface configured to receive a write command to write data to the memory;
    a data strobe pin configured to receive an external data strobe from a host device coupled to the semiconductor device, wherein the external data strobe is configured to assist in writing the data to the memory;
    phase division circuitry configured to divide the data strobe into a plurality of phases to be used in writing the data to the memory, wherein the phase division circuitry comprises:
       count detection circuitry configured to count bits received for a phase of the plurality of phases; and
       phase detection circuitry configured to identify which phase of the plurality of phases received a pulse of the data strobe first.

18. The semiconductor device of claim 17, wherein the phase division circuitry comprises a channel for each phase of the plurality of phases, and the phase detection circuitry is configured to determine whether a first channel or a second channel have begun counting bits first.

19. The semiconductor device of claim 18, wherein the first channel and second channel correspond to phases of the plurality of phases having an edge-type, and the edge-type comprises rising edges or falling edges of the data strobe.

20. The semiconductor device of claim 18, wherein the count detection circuitry comprises:

delay circuitry configured to delay bit counting in a delayed bit counting route;

a bypass output that bypasses the delay circuitry in a delay-bypassed route;

selection circuitry configured to output a signal indicating whether to use the delay circuitry based at least in part on whether a write preamble for the write command is longer than a threshold value; and a selector that selects between the delay-bypassed route and the delayed bit counting route based on the signal.

21. The semiconductor device of claim 20, wherein the selector comprises a multiplexor that uses the signal to select between the delay-bypassed route and the delayed bit counting route.

22. The semiconductor device of claim 20, wherein the selection circuitry is configured to output the signal based at least in part on whether the second channel is currently capturing a write command when the selection circuitry is in the first channel.

* * * * *